US007170112B2

(12) United States Patent
Ning

(10) Patent No.: US 7,170,112 B2
(45) Date of Patent: Jan. 30, 2007

(54) GRADED-BASE-BANDGAP BIPOLAR TRANSISTOR HAVING A CONSTANT—BANDGAP IN THE BASE

(75) Inventor: Tak Hung Ning, Yorktown Heights, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/283,705

(22) Filed: Oct. 30, 2002

(65) Prior Publication Data

US 2004/0084692 A1 May 6, 2004

(51) Int. Cl.
*H01L 29/739* (2006.01)
*H01L 31/0328* (2006.01)
*H01L 31/0336* (2006.01)

(52) U.S. Cl. ............... 257/197; 257/198; 257/199; 257/200

(58) Field of Classification Search ............ 257/197, 257/198, 199, 200
See application file for complete search history.

(56) References Cited

U.S. PATENT DOCUMENTS

| 5,352,912 A * | 10/1994 | Crabbe et al. ............ 257/198 |
| 5,494,836 A * | 2/1996 | Imai ....................... 438/312 |
| 5,508,537 A | 4/1996 | Kiyotaka |
| 5,648,294 A * | 7/1997 | Bayraktaroglu ........... 438/312 |
| 6,600,178 B1 * | 7/2003 | Washio et al. ............ 257/197 |

OTHER PUBLICATIONS

"Bipolar Transistor with Graded Band-Gap Base", By J.R. Hayes et al, Electronics Letters, May 26, 1983 vol. 19 No. 11 pp. 410-410.
Si/SiGe Epitaxial Base Transistors-Part 1:, Materials, Physics and Circuits, By D.L. Harame Et Al, IEEE Transactions on Free Dev. vol. 47, No. 3 Mar. 95 pp. 455-468.
"Defects in Epitaxial Multilayers" By J.W. Matthews & A.E. Blakeslee, Journal of Crystal Growth 27 (1974) 118-125 North Holland Publisher.
Patent Abstracts of Japan vol. 2000, No. 20, Jul. 10, 2001 & JP 2001 088480 A (Hitachi LTD; Hitachi Device Eng Co LTD), Mar. 16, 2001.
Patent Abstracts of Japan vol. 010, No. 104 (E-397), Apr. 19, 1986 & JP 60 242671 A (Nippon Denshin Denwa Kosha), Dec. 2, 1985.
Moore W T et al: "The Effect of Emitter Layer Variations on The Current Gain of Algas-Gaas Heterojunction Bipolar Transistors Grown by Chemical Beam Epitaxy" Journal of Crystal Growth, North-Holland Publishing Co. Amsterdam, NL, vol. 136, No. 1/4, Mar. 1, 1994, pp. 230-234, XP000501142 ISSN: 0022-0246.

* cited by examiner

*Primary Examiner*—Douglas W. Owens
*Assistant Examiner*—Samuel A Gebremariam
(74) *Attorney, Agent, or Firm*—Daniel P. Morris

(57) ABSTRACT

A bipolar transistor structure and process technology is described incorporating a emitter, a base, and a collector, with most of the intrinsic base adjacent the collector having a graded energy bandgap and a layer of the intrinsic base adjacent the emitter having a substantially constant energy bandgap. The invention has a smaller base transit time than a conventional graded-base-bandgap bipolar transistor.

2 Claims, 3 Drawing Sheets

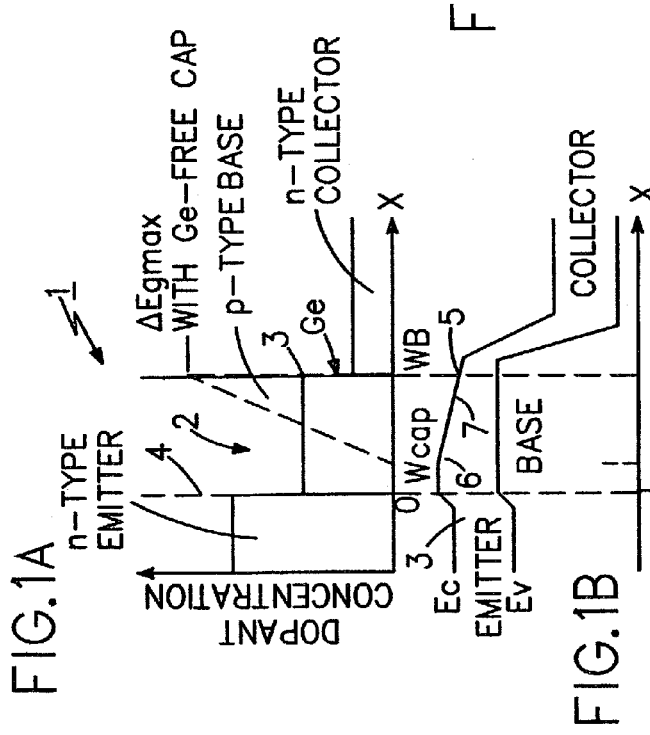
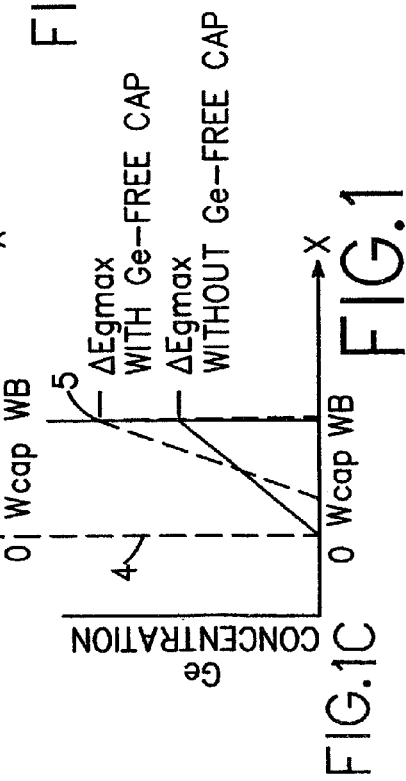
FIG. 1
FIG. 2 PRIOR ART $$\text{Eq1} \quad \left.\frac{t_B(\text{with Ge})}{t_B(\text{no Ge})}\right|_{W_{cap}=0} = 2\left(\frac{kT}{\Delta E_{gmax}}\right)\left\{1-\left(\frac{kT}{\Delta E_{gmax}}\right)\left[1-e^{-\Delta E_{gmax}/kT}\right]\right\}$$

$$\text{Eq2} \quad \Delta E_{gmax}(W_B - W_{cap}) = \text{CONSTANT}$$

$$\text{Eq3} \quad \frac{t_B(\text{with Ge})}{t_B(\text{no Ge})} = \frac{W_{cap}^2}{W_B^2} + 2\frac{W_{cap}(W_B-W_{cap})}{W_B^2}\left(\frac{kT}{\Delta E_{gmax}}\right)\left[1-e^{-\Delta E_{gmax}/kT}\right]$$

$$+ 2\frac{(W_B-W_{cap})^2}{W_B^2}\left(\frac{kT}{\Delta E_{gmax}}\right)\left\{1-\left(\frac{kT}{\Delta E_{gmax}}\right)\left[1-e^{-\Delta E_{gmax}/kT}\right]\right\}$$

FIG. 3

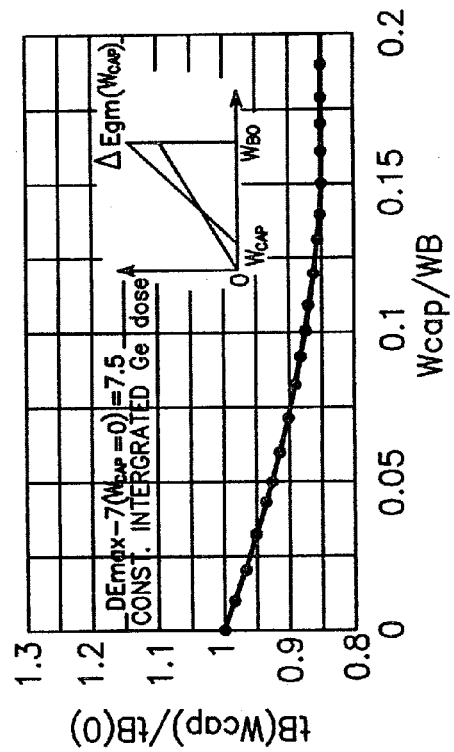

FIG. 4

GRADED-BASE-BANDGAP BIPOLAR TRANSISTOR HAVING A CONSTANT—BANDGAP IN THE BASE

FIELD OF THE INVENTION

The invention relates to a bipolar transistor wherein there is a graded band gap base between emitter and collector and in particular to a graded base bipolar transistor where there is a region of constant bandgap in the base adjacent to the emitter.

BACKGROUND OF THE INVENTION AND RELATION TO THE PRIOR ART

The invention involves interrelated structural and processing concepts. Such concepts are generally more clearly explained when related to the prior art where such principles are described as enunciated in the standard technical communications of the art. An example of such a standard communication is the text "Fundamentals of Modern VLSI Devices", by Y. Taur and T. H. Ning, published by The Cambridge University Press, in 1998 that enunciates the following bipolar transistor structure and terminology.

A bipolar transistor has a base region, a emitter region, and a collector region. The base region directly adjacent the emitter-base junction is the intrinsic base. The rest of the base region is the extrinsic base. The purpose of the extrinsic base is to provide electrical connection to the intrinsic base. The basic operation and device characteristics are determined primarily by the intrinsic base. One of the most important figures of merit of a bipolar transistor is its base transit time. When a bipolar transistor is turned from off to on, minority carriers are injected from the emitter into the intrinsic base and collected at the collector. In an n-p-n bipolar transistor, for example, electrons are injected from the n-type emitter into the p-type quasi-neutral intrinsic base layer. After traversing the quasi-neutral intrinsic base layer, the electrons are collected at the collector. The base transit time is the average time for an electron to traverse the p-type quasi-neutral intrinsic base layer. One important objective in the design of a bipolar transistor is to minimize the base transit time.

One approach in the art used to reduce the base transit time is to engineer the energy bandgap to provide a built-in drift field in the quasi-neutral intrinsic base layer to speed up the transport of minority carriers across it using the principles advanced in the publication "Bipolar Transistor with Graded Bandgap Base" by J. R. Hayes, F. Capasso, A. C. Gossard, R. J. Malik and W. Wiegman, publised in Electronics Letters, Vol. 19, pages 410–411, in 1983 wherein using as an example, the case of a GaAs bipolar transistor. In the example the drift field is accomplished by making the intrinsic base layer out of an alloy of Al and GaAs instead of GaAs alone. The compound semiconductor AlxGa1-xAs has a larger energy bandgap than GaAs. The larger the value of x, the larger the energy bandgap. By adjusting the value of x across the quasi-neutral base layer so that x is larger towards the emitter-base junction and smaller towards base-collector junction, an intrinsic base layer with graded bandgap is obtained In the structures in the art, the base transit time of a graded-base-bandgap transistor is smaller than that of a transistor where the energy bandgap is not graded in the quasi-neutral base.

In other structures in the art, as described in the publication, "Si/SiGe epitaxial-base transistors—Part I: Materials, physics, and circuits," by D. L. Harame, J. H. Comfort, J. D. Cressler, E. F. Crabbé, J. Y.-C. Sun, B. S. Meyerson, and T. Tice, in IEEE Trans. Electron Devices 42, pp. 455–468 (1995). The energy bandgap of silicon is larger than that of germanium. A SiGe-base bipolar transistor is a graded-base-bandgap bipolar transistors where the energy bandgap in the quasi-neutral base layer is larger towards the emitter-base junction and smaller towards the collector-base junction. The graded bandgap is achieved by designing the Ge distribution in the quasi-neutral base layer such that the Ge concentration is larger towards the collector end and smaller towards the emitter end.

SUMMARY OF THE INVENTION

In accordance with the invention, in a bipolar transistor having a quasi-neutral intrinsic base layer in which a constant-bandgap sublayer is provided adjacent the emitter-base junction, with a graded-bandgap region extending to the base to collector junction. Thus, in fabrication of the structure of the invention, instead of starting to grade the energy bandgap from the emitter-base junction all the way across the quasi-neutral intrinsic base layer, in this invention a constant-bandgap sublayer adjacent the emitter-base junction is produced. Bandgap grading is confined to the remainder of the quasi-neutral intrinsic base layer. The bandgap grading may be engineered by changing the quantity of a bandgap influencing ingredient in the material used for the base with respect to distance from a junction. Bipolar junction transistors with a constant bandgap sublayer in a graded bandgap base of the invention, are illustrated with systems of AlxGa1-xAs, and SiGe as examples.

BRIEF DESCRIPTION OF THE DRAWINGS

FIG. 1 is a schematic, dimensionally correlated with emitter to base and base to collector junction location, depiction of the conditions in an example emitter-base-collector bipolar transistor illustrating, the constant band gap sublayer adjacent to the emitter junction in the graded bandgap device, of the invention; in which:

FIG. 1A illustrates the dopant distribution in the transistor, specifically showing the distribution in the intrinsic part of an example n-p-n SiGe-base bipolar transistor with a triangular or linearly graded Ge profile. There is a Ge-free cap of thickness Wcap in the quasi-neutral base region.

FIG. 1B illustrates the energy band diagram in the emitter-base-collector regions in the n-p-n SiGe-base bipolar transistor in FIG. 1A. The energy bandgap of the base layer has a spatially constant region of width Wcap adjacent the emitter-base junction and then starts to narrow towards the collector end.

FIG. 1C illustrates the effect of increase of ingredient concentration with the invention; showing schematically the relationship between the maximum bandgap narrowing DEgmax, and the thickness of the Ge-free cap,Wcap.

FIG. 2—Prior Art is a schematic, dimensionally correlated with emitter to base and base to collector junction location, depiction of the conditions in prior art example emitter-base-collector bipolar transistor illustrating, a typical graded bandgap bipolar transistor; in which:

FIG. 2A illustrates the dopant distribution in the transistor, and,

FIG. 2B illustrates energy band diagram in the emitter-base-collector regions.

FIG. 3 is an equation table illustrating the interrelationship of the influencing factors in base transit time.

FIG. 4 is a graph illustrating a comparison the base transit time of the present invention, tB(Wcap), with respect to the base transit time of a conventional SiGe-base transistor specifically the base transit time of the invention, tB(Wcap), as compared to the base transit time of the example conventional SiGe base transistor without a Ge-free cap, tB(Wcap=0), as a function of the cap thickness. The width of the quasi neutral intrinsic base of the two transistors are the same. The Ge content is kept constant in the base layer with the value of Degmax=7.5 kT at Wcap=0.

In FIG. 5 there is shown the cross section of the starting wafer for making the example n-p-n SiGe-base bipolar transistor of the invention.

In FIG. 6 there is shown the cross section after deep trench isolation regions have been formed.

In FIG. 7 there is shown the cross section after the shallow trench regions have been formed.

In FIG. 8 there is shown the cross section after a heavily doped p-type base polysilicon layer has been deposited and the base window has been opened.

In FIG. 9 there is shown the cross section after the composite base layer has been formed. The bottom layer is p-type and contains a germanium distribution which causes bandgap grading. The top layer is p-type but contains no germanium and hence has a constant bandgap.

In FIG. 10 there is shown the cross section after an insulator for the base layer has been deposited.

In FIG. 11 there is shown the cross section after the insulator on the base layer has been etched to open the emitter window.

In FIG. 12 there is shown the cross section after a heavily doped n-type polysilicon has been deposited and patterned. This is the emitter polysilicon.

In FIG. 13 there is shown the cross section after the base polysilicon layer, together with the layers on top of it, are patterned by etching and a sidewall insulator is formed on the etched vertical surface. An emitter drive in step has been performed subsequently.

In FIG. 14 there is shown the cross section after the base contact window is etched open.

DESCRIPTION OF THE INVENTION

Figure 5:
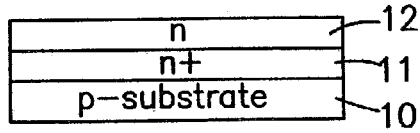
FIGS. 5 through 14 are depictions of progressively complete structures formed at steps in an exemplary process of implementing the invention; wherein a SiGe-base bipolar transistor is selected as the example. The SiGe-base-bipolar transistor being illustrated is to have deep trench isolation, polysilicon base contact layer, and polysilicon emitter.

In the invention, referring to FIGS. 1A, 1B and 1C, a bipolar transistor 1 having a quasi-neutral graded bandgap base region 2, where the bandgap 3 is decreasing from the emitter to base junction 4 to the collector to base junction 5; is modified by the providing of a constant-bandgap sublayer 6 positioned between the emitter to base junction 4 and the graded-bandgap region 2.

In other words in fabrication, instead of starting to grade the energy bandgap beginning at the emitter-base junction 4 all the way across the quasi-neutral intrinsic base layer to the collector to base junction 5, as in a conventional graded-base-bandgap bipolar transistor, the quasi-neutral intrinsic base layer of the present invention has a constant-bandgap sublayer 6 adjacent the emitter-base junction 4. Bandgap grading is confined to the remainder of the quasi-neutral intrinsic base layer 7.

As individual examples; consider the cases of a GaAs bipolar transistor with a AlxGa1-x As base and a SiGe base bipolar transistor with varying concentrations of Ge.

In the case of the GaAs bipolar transistor where the graded base is made of the compound semiconductor AlxGa1-xAs, instead of the value of x starting to decrease from the emitter-base junction 4 all the way across the base layer 2, as in a conventional graded-base GaAs bipolar transistor, in this invention the value of x is constant in the sublayer 6 adjacent the emitter-base junction 4 and decreases towards the collector 5 across the remainder 7 of the quasi-neutral intrinsic base layer.

In the case of a SiGe-base bipolar transistor, instead of having a graded distribution of Ge in the entire quasi-neutral intrinsic base layer 2, as in a conventional SiGe-base bipolar transistor in this invention there will be no Ge in the constant bandgap sublayer 6 adjacent the emitter-base junction 4 and a graded distribution of Ge in the remainder 7 of the quasi-neutral intrinsic base layer.

The description is considered to be clearer when compared to the prior art form of these structures as depicted with FIGS. 2A and 2B.

In the case of a GaAs bipolar transistor with an intrinsic base made of the compound semiconductor AlxGa1-xAs, instead of the value of x starts decreasing from the emitter-base junction all the way across the base layer, as in a conventional graded-base GaAs bipolar transistor, the value of x is constant in the quasi-neutral sublayer adjacent the emitter-base junction and decreases towards the collector across the remainder of the quasi-neutral intrinsic base layer.

In the case of a SiGe-base bipolar transistor, instead of having a graded distribution of Ge in the entire quasi-neutral intrinsic base layer, as in a conventional SiGe-base bipolar transistor, the present invention has no Ge in the sublayer of the quasi-neutral intrinsic base adjacent the emitter-base junction and a graded distribution of Ge in the remainder of the quasi-neutral intrinsic base layer.

In conventional graded-base-bandgap transistors such as described in Hayes et al, and Harame et al above, have no constant-bandgap region within the quasi-neutral base layer. To examine how the conventional grading of the energy bandgap in the quasi-neutral intrinsic base reduces the base transit time, we consider a conventional SiGe-base transistor. The results apply to conventional graded-base-bandgap bipolar transistors in general.

FIG. 2A illustrates the dopant distribution in the intrinsic part of a conventional n-p-n SiGe-base bipolar transistor with a triangular or linearly graded Ge profile, shown dotted as 8, and FIG. 2B is a correlated band energy diagram. Here the emitter-base junction is assumed to be located at x=0, and the base-collector junction is assumed to be located at x=WB, and the width of the quasi-neutral intrinsic base layer is WB. For simplicity of illustration, the depletion regions of the emitter-base diode and the base-collector diode are assumed to be zero in FIG. 2. The Ge distribution in the base causes a maximum bandgap narrowing, DEgmax, at the collector end of the quasi-neutral base layer. Referring to the corresponding energy-band diagram illustrated in FIG. 2B, Ec is the bottom of the conduction-band and Ev is the top of the valence band. The diagram shows that, in the conventional SiGe-base bipolar transistor, the energy bandgap of the intrinsic base layer starts to narrow from the emitter end towards the collector end, without any region of spatially constant energy gap.

Further considering the conventional SiGe-base transistor with a Ge distribution illustrated in FIGS. 2A and 2B, the ratio of the base transit time of the SiGe-base transistor, tB(with Ge), to the base transit time of a Si-base transistor, tB(no Ge), having the same p-type dopant distribution in the quasi-neutral base layer is given by Equation 1 in FIG. 3.

The base transit time ratio represents the improvement due to the presence of Ge in the quasi-neutral intrinsic base layer. Equation (1) shows that the improvement in base transit time is independent of the base width, but is a function of the total amount of bandgap narrowing, DEgmax, across the base layer. The larger the value of DEgmax, the smaller the base transit time ratio.

In this context the bipolar transistor of the invention provides a quasi-neutral intrinsic base layer consisting of a constant-bandgap sublayer on top of a graded-bandgap sublayer. Thus, instead of starting grading the energy bandgap from the emitter-base junction all the way across the quasi-neutral intrinsic base layer, as in a conventional graded-base-bandgap bipolar transistor, this invention has a constant-bandgap sublayer adjacent the emitter-base junction. Bandgap grading is confined to the remainder of the quasi-neutral intrinsic base layer.

In the case of a GaAs bipolar transistor with an intrinsic base made of the compound semiconductor $AlxGa1-xAs$, instead of the value of x starts decreasing from the emitter-base junction all the way across the base layer, as in a conventional graded-base GaAs bipolar transistor the value of x is constant in the quasi-neutral sublayer adjacent the emitter-base junction and decreases towards the collector across the remainder of the quasi-neutral intrinsic base layer.

In the case of a SiGe-base bipolar transistor, instead of having a graded distribution of Ge in the entire quasi-neutral intrinsic base layer, as in a conventional SiGe-base bipolar transistor the invention will have no Ge in the sublayer of the quasi-neutral intrinsic base adjacent the emitter-base junction and a graded distribution of Ge in the remainder of the quasi-neutral intrinsic base layer.

DETAILED DESCRIPTION

A n-p-n SiGe-base bipolar transistor is used here to describe the details of the invention. The results are applicable to graded-base-bandgap bipolar transistors in general. The results are particularly applicable to heterojunction bipolar transistors having graded-base-bandgap and wide-gap emitter.

FIG. 1A illustrates the dopant distribution in the intrinsic part of a an n-p-n SiGe-base bipolar transistor according to the invention, with a triangular or linearly graded Ge profile in the graded-bandgap portion of the quasi-neutral intrinsic base. Here the emitter-base junction is assumed to be located at x=0, and the base-collector junction is assumed to be located at x=WB, and the width of the quasi-neutral base layer is WB. The width of the Ge-free cap is Wcap. The corresponding energy-band diagram is illustrated in FIG. 1B. Ec is the bottom of the conduction-band and Ev is the top of the valence band. It shows that the energy bandgap of the quasi-neutral intrinsic base layer has a spatially constant region of width Wcap adjacent the emitter-base junction and then starts to narrow towards the collector end.

Silicon and germanium have slightly difference lattice constants. In engineering the silicon energy bandgap by adding germanium to silicon, the silicon lattice is strained in order to accommodate the germanium atoms. If too much germanium is added, the silicon can become excessively strained, causing dislocations to form in the silicon. Thus there is a limit on how much germanium can be added without building up excessive strain in the silicon layer. As a general rule, if the Ge-containing layer is thin, the Ge concentration can be large, such that the product of the Ge concentration and the thickness of Ge-containing layer does not exceed the stability limit as set forth in the publication "Defects in Epitaxial Multilasyers" by J. W. Matthews and A. E. Blakeslee in J. Crystal Growth, Vo. 27, pp 118–125 (1974). Therefore, for this invention, as the Ge distribution in the quasi-neutral base layer is compressed to form the Ge-free cap, the peak Ge concentration can be increased and yet maintain the stability of the Ge-containing film provided that the cap thickness and the peak concentration vary according to Eq 2 in FIG. 3. The relation between DEgmax and Wcap according to Eq. 2 is illustrated in FIG. 1C. For a SiGe-base transistor of this invention, the transit time ratio is given by Eq 3 in FIG. 3.

The benefits in performance achieved in the invention through referring to a comparison of Eq. 1 with Eq. 3 in FIG. 3. In the comparison we see that the third term in Eq. 3 represents the contribution to the base transit time from the graded-bandgap region of the base, while the first term in Eq. 3 represents the contribution from the constant-bandgap region of the invention, element 6 in the band diagram in FIG. 1B. The second term in Eq. 3, which is zero when the Ge-free cap layer thickness is zero and also zero when the Ge-free cap layer is equal to the base width, represents the contribution to the base transit time due to the interdependence between the constant-bandgap region and the graded-bandgap region.

The net effect is that the base transit time of the present invention is reduced compared to that of the conventional SiGe-base bipolar transistor. If the peak Ge concentration is increased as the Ge-free cap thickness is increased, for example in accordance with Eq. 2, then the increase in peak Ge concentration will further contribute to reduction in base transit time.

Referring to FIG. 4 a comparison of the base transit time of the invention with the base transit time of a conventional SiGe transistor such as is depicted in FIGS. 2A and 2B. In the graph of FIG. 4 the ratio of the base transit time of the invention, tB(Wcap), to the base transit time of the conventional SiGe-base transistor without Ge-free cap, tB(Wcap=0), is plotted in the vertical scale as a function of the cap thickness in the horizontal scale. The Ge content is kept constant in the base layer in accordance with equation 2, with a value of DEgmax=7.5 kT at Wcap=0 which shows that, when compared with a conventional SiGe-base transistor, the SiGe-base transistor of the invention has a base transit time that is shorter by about 15% when the cap thickness is increased to about 15% of the width of the quasi-neutral intrinsic base, a significant reduction in base transit time.

It is observed that equation 3 is applicable to a graded-base-bandgap bipolar transistor in general, even though a SiGe-base bipolar transistor is used to derive it, so that there is applicability to compound-semiconductor bipolar transistors, such as a GaAs bipolar transistor having an graded-bandgap $AlxGa1-xAs$ base layer.

Using the fabrication of a SiGe base bipolar transistor with deep trench isolation with polysilicon base contacting and polysilicon emitter construction as an illustration the bipolar transistors may be fabricated as outlined in connection with FIGS. 5 to 14 following.

FIG. 5 illustrates the starting wafer for making an n-p-n bipolar transistor. It consists of a p-substrate 10 and an n-type layer 12, with a heavily doped n+ layer 11 in between. The n layer 12 will form the collector of the transistor, and the n+ layer 11 will form the subcollector of the transistor.

Figure 6:
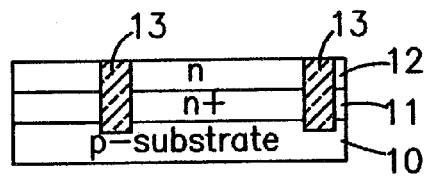

In FIG. 6 deep isolation trenches 13 are then formed by etching through the n and n+ layers and then back filling with oxide and planarized.

Figure 7:
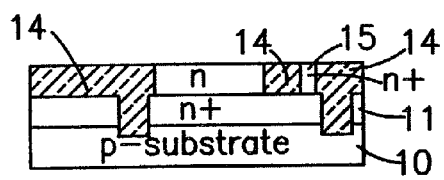

In FIG. 7 the shallow trenches 14 are etched and then filled with oxide and planarized to a single top surface. The deep trenches 13, together with the p-substrate 10, isolate one transistor from another.

The collector reach through region 15 is doped heavily n type, typically done by ion implantation. The resulting structure is further depicted in FIG. 7.

Figure 8:
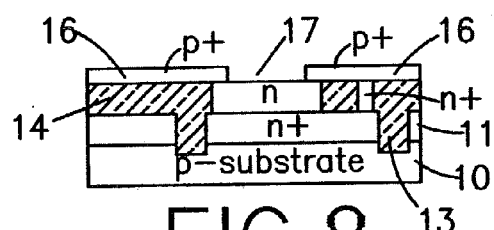
Figure 10:
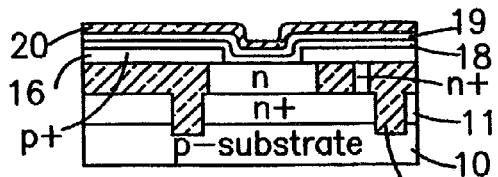
Figure 11:
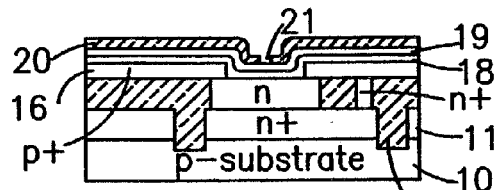

In FIG. 8 a heavily boron doped polysilicon layer 16 is then formed on the planarized top surface. This polysilicon layer serves only to reduce the extrinsic base resistance of the transistor. The polysilicon layer is patterned to open a window 17 which defines the base window as shown in FIG. 10. The patterned polysilicon regions 16 may or may not overlap the n-type collector region.

Figure 9:
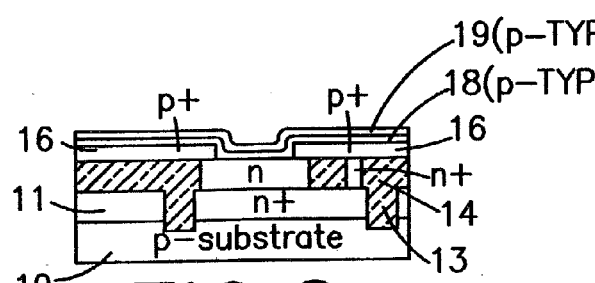

In FIG. 9, the base layer is formed by first forming a p-type layer 18 which contains a Ge distribution, and then forming a p-type layer 19 on top which contains no germanium.

Layers 18 and 19 are typically formed by epitaxially depositing silicon. For layer 18, germanium and boron are mixed in during silicon deposition. The Ge concentration is large towards the bottom of the layer and small towards the top of the layer in order to result in a graded bandgap across the layer. For layer 19, only boron is mixed in during silicon deposition. There is no Ge in layer 19, and the bandgap is constant across the layer.

An insulating layer 20, for example an oxide layer, is then formed on top, as shown in FIG. 10. A window 21 is etched open in layer 20, as shown in FIG. 1. This is the emitter window. If desired, the collector region directly underneath the emitter window can be doped more heavily n-type by ion implantation through the emitter window. Increasing the doping concentration in the collector underneath the emitter window allows the transistor to operate at higher collector current densities without suffering from the detrimental effects of base widening. For simplicity of illustration, this is not shown in FIG. 11.

Figure 12:
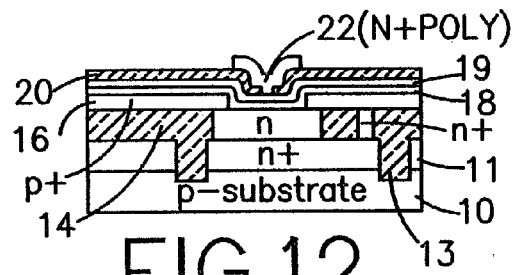
Figure 13:
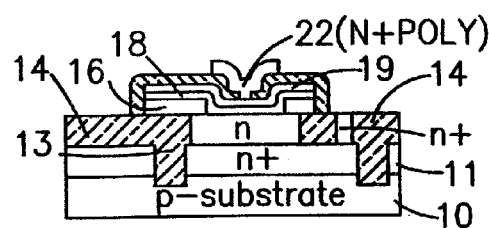
Figure 14:
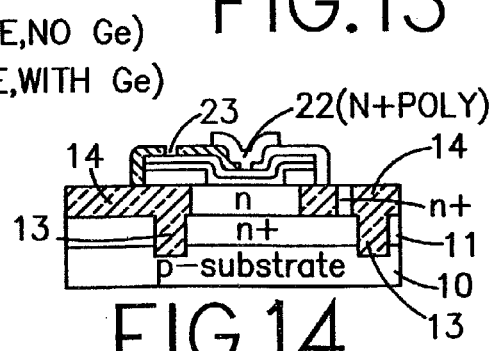

Referring to FIG. 12, a layer of polysilicon heavily doped n-type is then deposited and patterned to form the polysilicon emitter 22. The extrinsic base of the transistor is then patterned by a masked etching of layers 16, 18, 19, and 20. This is followed by the deposition and etching of an insulator layer, such as an oxide layer, to form an insulating sidewall on the etched vertical surface of layers 16, 18, 19, and 20, as illustrated in FIGS. 13 & 14. As a result of these steps, the collector 15 is exposed for electrical contact, as indicated in FIG. 14. A thermal heat cycle is then performed to drive in the emitter. This drive in step also causes boron to out diffuse from the heavily doped base polysilicon layer 16, causing layers 18 and 19 directly above and around layer 16 to be doped heavily p-type as well, as also illustrated in FIG. 14.

The base contact window 23 is then etched open, as further shown in FIG. 14. The transistor is now ready for formation of metal contacts, which are not shown for simplicity of illustration.

What has been described is a structural principle for the providing of a constant bandgap region adjacent to the emitter junction of a graded base bipolar transistor that provides a more rapid carrier transit across that base.

What is claimed is:

1. A bipolar transistor having an emitter region, a collector region, and a quasi-neutral intrinsic base layer,
    said quasi neutral intrinsic base layer being located between said emitter region and said collector region,
    said quasi neutral intrinsic base layer comprising
        a sublayer of silicon, positioned adjacent said emitter region, and having a constant energy gap across said sublayer,
    said quasi neutral intrinsic base layer, further having, positioned adjacent said collector region, a layer of an alloy of silicon and germanium of composition $Si(1-x)Ge(x)$ with the value of x varying across said intrinsic base layer such that x is larger towards said collector region and smaller towards said silicon sublayer.

2. A bipolar transistor having an emitter region, a collector region, and a quasi-neutral intrinsic base layer,
    said quasi neutral intrinsic base layer being located between said emitter region and said collector region,
    said quasi neutral intrinsic base layer having first and second sublayers and made of the compound semiconductor AlGaAs wherein;
    said first sublayer is of composition $Al(x) Ga(1-x)As$ with x being constant across the entire sublayer, and,
    said second sublayer is of $Al(y) Ga(1-y)As$ with y varying across the sublayer such that $y=x$ adjacent said first sublayer and decreases toward said collector region.

* * * * *